US012509766B2

(12) United States Patent
Matsuyama et al.

(10) Patent No.: US 12,509,766 B2
(45) Date of Patent: Dec. 30, 2025

(54) FILM DEPOSITION METHOD AND FILM DEPOSITION APPARATUS

(71) Applicant: Tokyo Electron Limited, Tokyo (JP)

(72) Inventors: Yohei Matsuyama, Yamanashi (JP); Daichi Ito, Yamanashi (JP); Takeshi Oyama, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/776,812

(22) Filed: Jul. 18, 2024

(65) Prior Publication Data

US 2025/0043415 A1 Feb. 6, 2025

(30) Foreign Application Priority Data

Aug. 1, 2023 (JP) ................................ 2023-125400

(51) Int. Cl.

*C23C 16/34* (2006.01)
*C23C 16/455* (2006.01)
*C23C 16/52* (2006.01)

(52) U.S. Cl.

CPC ...... *C23C 16/345* (2013.01); *C23C 16/45536* (2013.01); *C23C 16/45553* (2013.01); *C23C 16/52* (2013.01)

(58) Field of Classification Search

CPC ........... C23C 16/345; C23C 16/45536; C23C 16/455553; C23C 16/52
See application file for complete search history.

(56) References Cited

U.S. PATENT DOCUMENTS

2011/0129619 A1* 6/2011 Matsunaga ........... C23C 16/345 427/248.1

FOREIGN PATENT DOCUMENTS

JP 2019-029582 2/2019

* cited by examiner

*Primary Examiner* — Nathan T Leong
(74) *Attorney, Agent, or Firm* — IPUSA, PLLC

(57) ABSTRACT

A film deposition method includes forming a seed layer containing silicon atoms and nitrogen atoms on a metal film of a substrate by supplying a first silicon-containing gas and a first nitriding gas to the substrate in a state where the substrate is maintained at a first temperature; and forming a bulk layer containing silicon atoms and nitrogen atoms on the seed layer by supplying a second silicon-containing gas and a second nitriding gas to the substrate in a state where the substrate is maintained at a second temperature greater than the first temperature.

9 Claims, 9 Drawing Sheets

FILM DEPOSITION METHOD AND FILM DEPOSITION APPARATUS

CROSS-REFERENCE TO RELATED APPLICATIONS

This patent application is based on and claims priority to Japanese Patent Application No. 2023-125400 filed on Aug. 1, 2023, the entire contents of which are incorporated herein by reference.

TECHNICAL FIELD

The present disclosure relates to a film deposition method and a film deposition apparatus.

BACKGROUND

A method of forming a silicon oxide film on a tungsten film by an atomic layer deposition (ALD) method using a silicon-containing gas and reactive oxygen species is known (for example, see Patent Document 1). In Patent Document 1, after a first silicon oxide film is formed by low temperature film deposition at 25° C. to 350° C., a second silicon oxide film is formed by medium to high temperature film deposition at 500° C. to 750° C., thereby suppressing oxidation of the tungsten film.

RELATED ART DOCUMENT

Patent Document

[Patent Document 1] Japanese Laid-open Patent Application Publication No. 2019-29582

SUMMARY

A film deposition method according to one aspect includes forming a seed layer containing silicon atoms and nitrogen atoms on a metal film of a substrate by supplying a first silicon-containing gas and a first nitriding gas to the substrate in a state where the substrate is maintained at a first temperature; and forming a bulk layer containing silicon atoms and nitrogen atoms on the seed layer by supplying a second silicon-containing gas and a second nitriding gas to the substrate in a state where the substrate is maintained at a second temperature greater than the first temperature.

DETAILED DESCRIPTION

In the following, non-restrictive exemplary embodiments of the present disclosure will be described with reference to the accompanying drawings. In all the accompanying drawings, the same or corresponding members or parts are denoted by the same or corresponding reference symbols, and duplicated description is omitted.

[Film Deposition Method]

Figure 1:
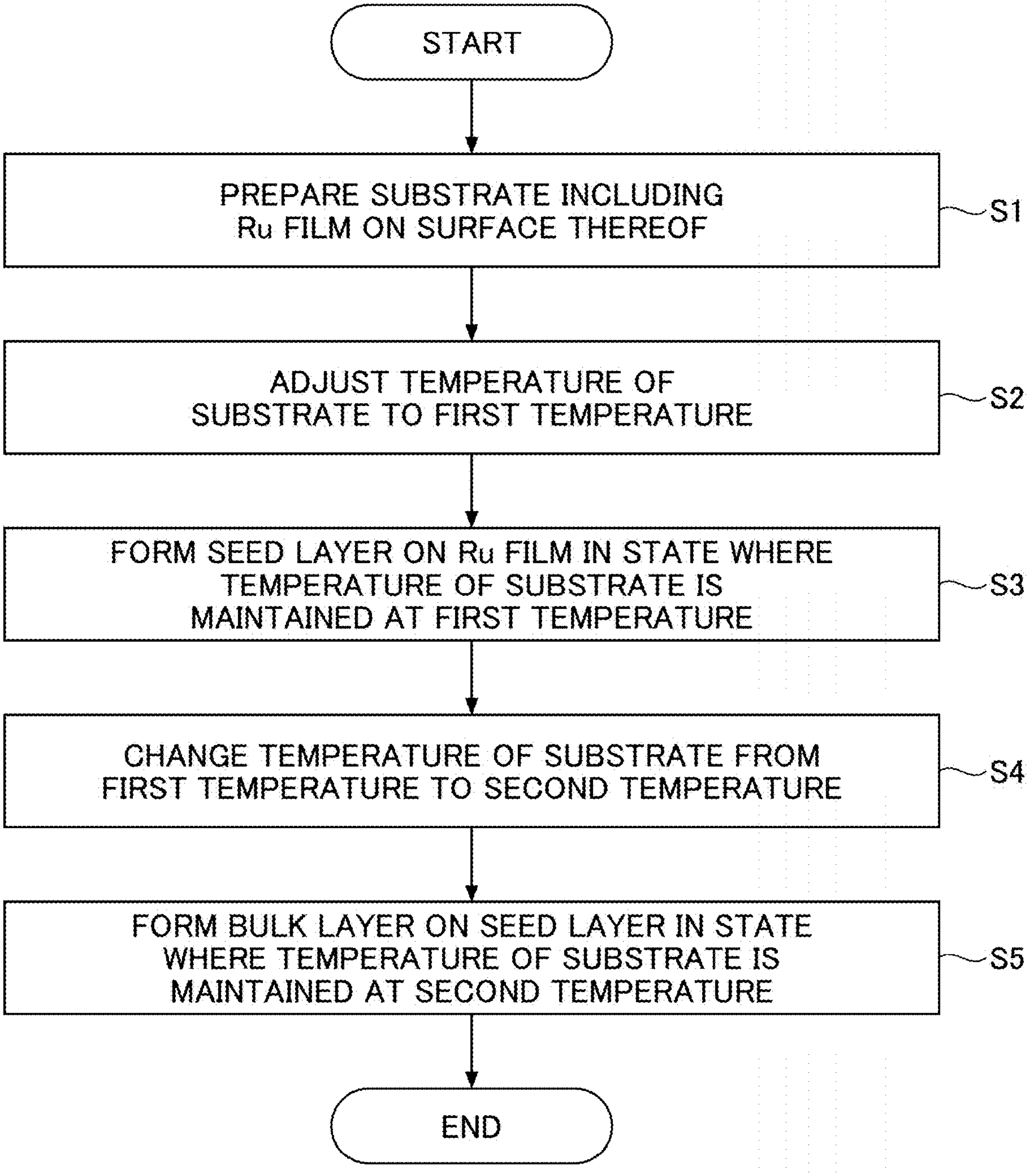
FIG. 1 is a flowchart illustrating a film deposition method according to an embodiment.
Figure 2A:
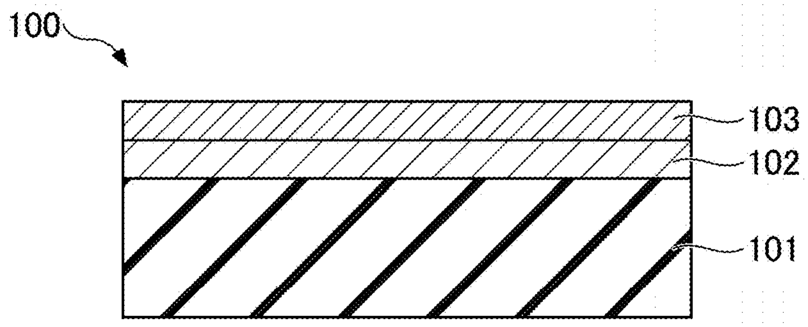
FIG. 2A is a cross-sectional view illustrating the film deposition method according to the embodiment.
Figure 2B:
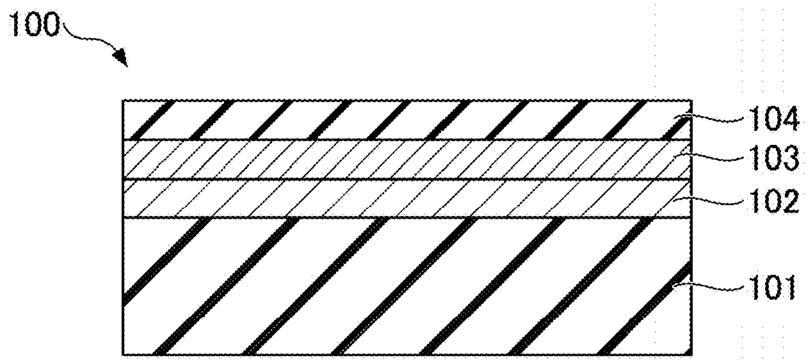
FIG. 2B is a cross-sectional view illustrating the film deposition method according to the embodiment.
Figure 2C:
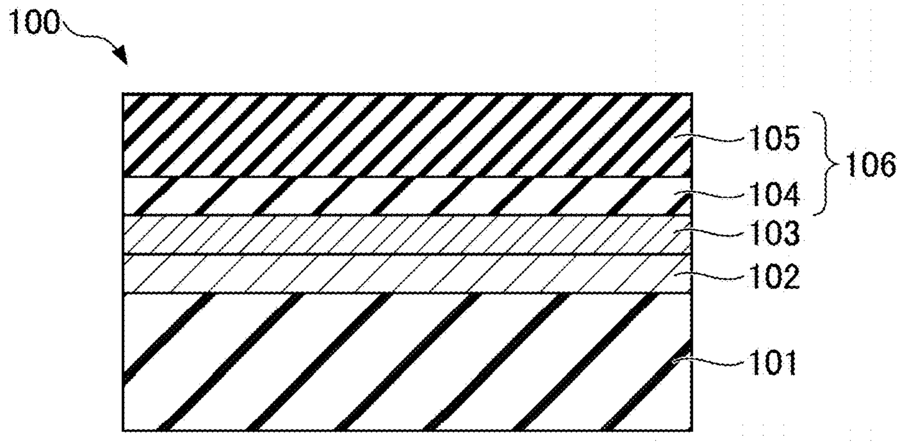
FIG. 2C is a cross-sectional view illustrating the film deposition method according to the embodiment.

A film deposition method according to an embodiment will be described with reference to FIG. 1 and FIG. 2A, FIG. 2B, and FIG. 2C. FIG. 1 is a flowchart illustrating the film deposition method according to the embodiment. FIG. 2A, FIG. 2B, and FIG. 2C are cross-sectional views illustrating the film deposition method according to the embodiment. In the embodiment, a case where a silicon nitride (SiN) film, which is an example of a film containing silicon (Si) atoms and nitrogen (N) atoms, is formed on a ruthenium (Ru) film, which is an example of a metal film, will be described as an example.

In step S1, as illustrated in FIG. 2A, a substrate 100 is prepared. The substrate 100 includes an insulating film 101, a barrier metal film 102, and a Ru film 103. The insulating film 101 is, for example, a thermal oxide film. The barrier metal film 102 is provided on the insulating film 101. The barrier metal film 102 is, for example, a titanium nitride (TiN) film. The Ru film 103 is provided on the barrier metal film 102. The Ru film 103 is formed by, for example, a physical vapor deposition (PVD) method. The Ru film 103 may be heat-treated under a reduced-pressure atmosphere or an inert gas atmosphere maintained at, for example, 600° C. or greater and 700° C. or less. In this case, the resistivity can be reduced by increasing the crystal grain size of the Ru film 103.

Step S2 is performed after step S1. In step S2, the temperature of the substrate 100 is adjusted to a first temperature. For example, the substrate 100 is accommodated in the processing chamber, and the processing chamber is heated by a heater so that the temperature of the substrate 100 becomes the first temperature. The first temperature is, for example, 550° C. or less. In this case, if the Ru film 103 is exposed to a high temperature in step S3, the resistivity of the Ru film 103 is less likely to increase.

Step S3 is performed after step S2. In step S3, in a state where the temperature of the substrate 100 is maintained at the first temperature, a seed layer 104 is formed on the Ru film 103 as illustrated in FIG. 2B. The seed layer 104 is, for example, a SiN seed layer. The seed layer 104 can be formed by, for example, a thermal ALD method in which supplying a first silicon-containing gas to the substrate 100 and supplying a first nitriding gas to the substrate 100 are alternately repeated. In this case, the seed layer 104 is easily formed conformally along the surface of the Ru film 103. The first silicon-containing gas is, for example, a hexachlorodisilane (HCD) gas. The first nitriding gas is, for example, an ammonia ($NH_3$) gas. The thickness of the seed layer 104 is, for example, less than the thickness of a bulk layer 105. The thickness of the seed layer 104 is, for example, 0.6 nm or greater. In this case, if the Ru film 103 is exposed to a high temperature in step S3, the resistivity of the Ru film 103 is less likely to increase.

Step S4 is performed after step S3. In step S4, the temperature of the substrate 100 is changed from the first temperature to a second temperature. The second temperature is greater than the first temperature. The second temperature is, for example, 600° C. or greater. In this case, in step S5, the bulk layer 105 is easily formed with high quality.

Step S5 is performed after step S4. In step S5, in a state where the temperature of the substrate 100 is maintained at the second temperature, the bulk layer 105 is formed on the seed layer 104 as illustrated in FIG. 2C. The bulk layer 105 can be formed by, for example, a plasma ALD method in which supplying a second silicon-containing gas to the substrate 100 and exposing the substrate 100 to plasma generated from a second nitriding gas are alternately repeated. In this case, the bulk layer 105 having a high quality can be formed conformally along the surface of the seed layer 104. The second silicon-containing gas is, for example, a gas different from the first silicon-containing gas. The second silicon-containing gas is, for example, a dichlorosilane (DCS) gas. The second nitriding gas is, for example, the same gas as the first nitriding gas. The second nitriding gas is, for example, an ammonia gas.

By steps S1 to S5 described above, a SiN film 106 in which the seed layer 104 and the bulk layer 105 are stacked on the Ru film 103 can be formed.

When the SiN film 106 is formed on the Ru film 103 at a high temperature, silicon (Si) atoms contained in the SiN film 106 are diffused into the Ru film 103, and a ruthenium silicide (RuSi) layer is formed in the Ru film 103. When the RuSi layer is formed in the Ru film 103, the resistance of the Ru film 103 increases.

In the film deposition method according to the embodiment, the seed layer 104 is formed on the Ru film 103 at a low temperature (the first temperature), and then the bulk layer 105 is formed at a high temperature (the second temperature), so that the SiN film 106 in which the seed layer 104 and the bulk layer 105 are stacked is formed. Because the seed layer 104 formed in a state where the surface of the Ru film 103 is exposed is formed at a low temperature, silicidation of the Ru film 103 is unlikely to progress. Additionally, when the bulk layer 105 is formed at a high temperature in a state where the surface of the Ru film 103 is covered with the seed layer 104, silicidation of the Ru film 103 can be suppressed. In particular, when the thickness of the seed layer 104 is 0.6 nm or greater, silicidation of the Ru film 103 does not appreciably occur. As a result, the increase in the resistivity of the Ru film 103 can be suppressed.

[Film Deposition Apparatus]

Figure 3:
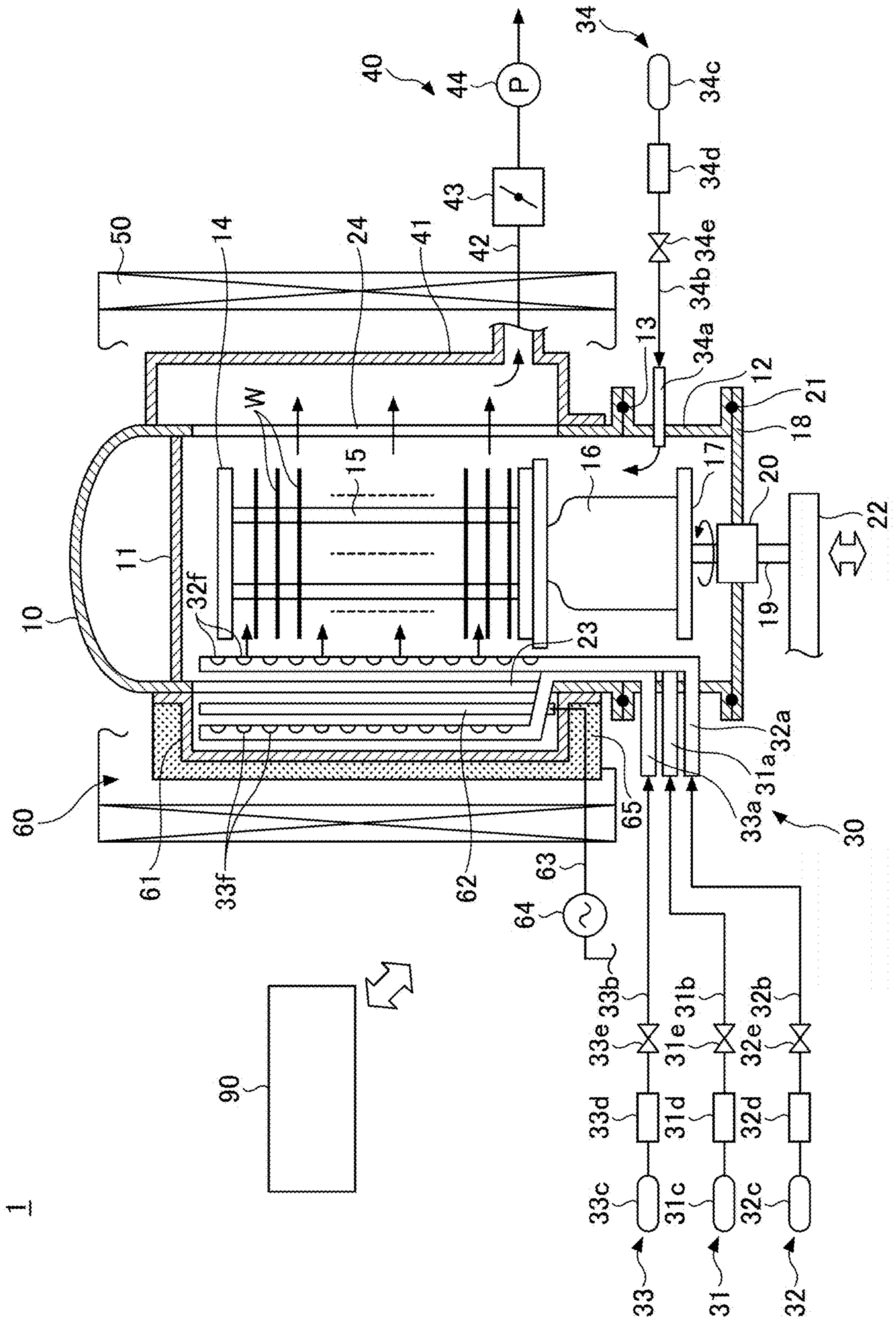
FIG. 3 is a vertical sectional view illustrating a film deposition apparatus according to the embodiment.
Figure 4:
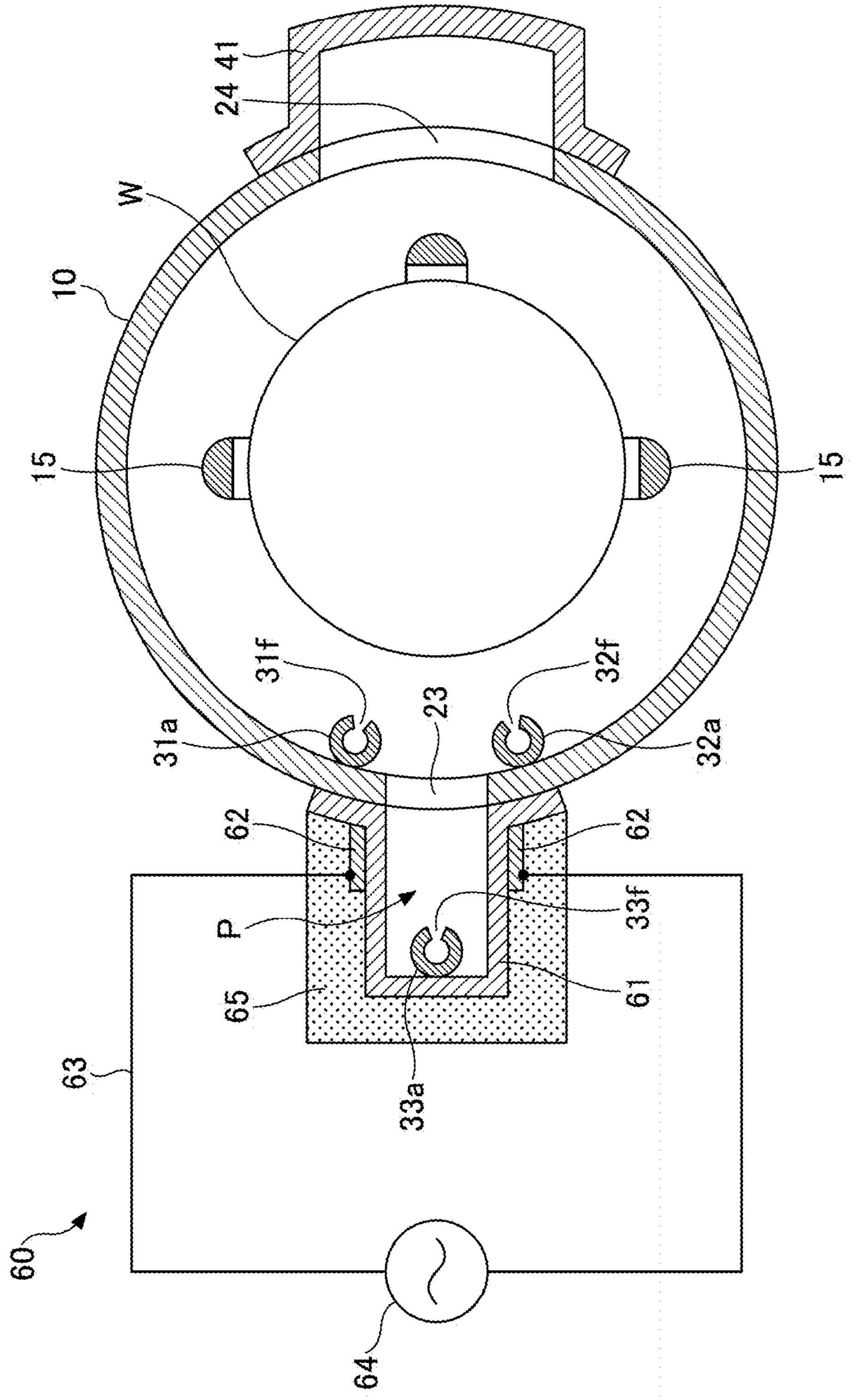
FIG. 4 is a horizontal sectional view illustrating the film deposition apparatus according to the embodiment.

A film deposition apparatus 1 according to the embodiment will be described with reference to FIG. 3 and FIG. 4. FIG. 3 is a vertical sectional view illustrating the film deposition apparatus 1 according to the embodiment. FIG. 4 is a horizontal sectional view illustrating the film deposition apparatus 1 according to the embodiment.

The film deposition apparatus 1 includes a processing chamber 10, a gas supply 30, an exhaust section 40, a heater section 50, a plasma generation mechanism 60, and a controller 90.

The processing chamber 10 has a vertical cylindrical shape having a ceiling and having an opening at a lower end thereof. The processing chamber 10 is made of, for example, quartz. A ceiling plate 11 made of quartz is provided near the upper end of the processing chamber 10, and a region below the ceiling plate 11 is sealed. A manifold 12 formed in a cylindrical shape is connected to the opening at the lower end of the processing chamber via a seal member 13, such as an O-ring. The manifold 12 is made of, for example, a metal.

The manifold 12 supports the lower end of the processing chamber 10. A boat 14 is inserted into the processing chamber 10 from below the manifold 12. The boat 14 holds multiple substrates W at intervals along the vertical direction. The boat 14 holds each of the substrates W in a horizontal position. The boat 14 is made of, for example, quartz. The boat 14 includes, for example, three support columns 15. Grooves (not illustrated) are formed in each of the support columns 15 at predetermined intervals along the vertical direction. The boat 14 holds multiple substrates W by the grooves. The substrate W is, for example, a semiconductor wafer.

The boat 14 is mounted on a table 17 via a heat insulating cylinder 16 made of quartz. The table 17 is supported on a rotary shaft 19 penetrating a cover 18. The cover 18 opens and closes the opening at a lower end of the manifold 12. The cover 18 is made of, for example, stainless steel.

A magnetic fluid seal 20 is provided at a penetration portion of the rotary shaft 19. The magnetic fluid seal 20 seals the rotary shaft 19 in an airtight manner and rotatably supports the rotary shaft 19. A seal member 21 is provided between a peripheral portion of the cover 18 and the lower end of the manifold 12. The seal member 21 maintains airtightness inside the processing chamber 10. The seal member 21 is, for example, an O-ring.

The rotary shaft 19 is attached to a leading end of an arm 22 supported by a raising and lowering mechanism (not illustrated), such as a boat elevator. With this, the boat 14 and the cover 18 are raised and lowered together, and are inserted into and removed from the processing chamber 10.

An opening 23 and an exhaust port 24 are provided in a sidewall of the processing chamber 10. The opening 23 is formed to be vertically elongated so as to span a range including all the substrates W supported by the boat 14 in the vertical direction. The exhaust port 24 is provided at a position facing the opening 23, for example. The exhaust port 24 is formed to be vertically elongated so as to span a range including all the substrates W supported by the boat 14 in the vertical direction.

The gas supply 30 is configured to introduce various processing gases used in the above-described film deposition method into the processing chamber 10. The gas supply 30 includes an HCD supply 31, a DCS supply 32, an ammonia supply 33, and a nitrogen supply 34.

The HCD supply 31 includes an HCD supply pipe 31*a* in the processing chamber 10 and an HCD supply path 31*b* outside the processing chamber 10. In the HCD supply path 31*b*, an HCD supply source 31*c*, a mass flow controller 31*d*, and a valve 31*e* are provided in this order from the upstream side to the downstream side in the gas flow direction. With this, a supply timing of an HCD gas of the HCD supply source 31*c* is controlled by the valve 31*e* and a flow rate of the HCD gas is adjusted to a predetermined flow rate by the mass flow controller 31*d*. The HCD gas flows into the HCD supply path 31*b* from the HCD supply pipe 31*a* and is discharged into the processing chamber 10 from the HCD supply pipe 31*a*.

The DCS supply 32 includes a DCS supply pipe 32*a* in the processing chamber 10 and a DCS supply path 32*b* outside the processing chamber 10. In the DCS supply path 32*b*, a DCS source 32*c*, a mass flow controller 32*d*, and a valve 32*e* are provided in this order from the upstream side to the downstream side in the gas flow direction. With this, a supply timing of a DCS gas of the DCS source 32*c* is controlled by the valve 32*e* and a flow rate of the DCS gas is adjusted to a predetermined flow rate by the mass flow controller 32*d*. The DCS gas flows into the DCS supply pipe 32*a* from the DCS supply path 32*b* and is discharged into the processing chamber 10 from the DCS supply pipe 32*a*.

The ammonia supply 33 includes an ammonia supply pipe 33*a* in the processing chamber 10 and an ammonia supply path 33*b* outside the processing chamber 10. In the ammonia supply path 33*b*, an ammonia source 33*c*, a mass flow controller 33*d*, and a valve 33*e* are provided in this order from the upstream side to the downstream side in the gas flow direction. With this, a supply timing of an ammonia gas of the ammonia source 33*c* is controlled by the valve 33*e* and a flow rate of the ammonia gas is adjusted to a predetermined flow rate by the mass flow controller 33*d*. The ammonia gas flows into the ammonia supply path 33*b* from the ammonia supply pipe 33*a* and is discharged into the processing chamber 10 from the ammonia supply pipe 33*a*.

The nitrogen supply 34 includes a nitrogen gas supply pipe 34*a* in the processing chamber 10 and a nitrogen gas supply path 34*b* outside the processing chamber 10. In the nitrogen gas supply path 34*b*, a nitrogen source 34*c*, a mass flow controller 34*d*, and a valve 34*e* are provided in this order from the upstream side to the downstream side in the gas flow direction. With this, a supply timing of a nitrogen gas of the nitrogen source 34*c* is controlled by the valve 34*e*, and a flow rate of the nitrogen gas is adjusted to a predetermined flow rate by the mass flow controller 34*d*. The nitrogen gas flows into the nitrogen gas supply pipe 34*a* from the nitrogen gas supply path 34*b* and is discharged into the processing chamber 10 from the nitrogen gas supply pipe 34*a*.

The HCD supply pipe 31*a* and the DCS supply pipe 32*a* are supported such that the HCD supply pipe 31*a* and the DCS supply pipe 32*a* extend vertically along the inner wall of the processing chamber 10, base ends thereof are bent in an L shape, and extend horizontally to penetrate the manifold 12. Multiple HCD discharge ports 31*f* are provided in a portion of the HCD supply pipe 31*a* located in the processing chamber 10. Multiple DCS discharge ports 32*f* are provided in a portion of the DCS supply pipe 32*a* located in the processing chamber 10.

The ammonia supply pipe 33*a* is supported such that the ammonia supply pipe 33*a* extends vertically along a plasma partition wall 61 in a plasma generation space P, which will be described later, a base end thereof is bent in an L shape, and extends horizontally to penetrate the manifold 12. Multiple ammonia discharge ports 33*f* are provided in a portion of the ammonia supply pipe 33*a* located in the processing chamber 10.

The nitrogen gas supply pipe 34*a* is supported such that the nitrogen gas supply pipe 34*a* extends horizontally in the processing chamber 10, and penetrates through a sidewall of the manifold 12. The nitrogen gas supply pipe 34*a* has an opening at its tip and discharges the nitrogen gas from the opening.

The HCD supply pipe 31*a*, the DCS supply pipe 32*a*, the ammonia supply pipe 33*a*, and the nitrogen gas supply pipe 34*a* are made of, for example, quartz.

The respective discharge ports (the HCD discharge ports 31*f*, the DCS discharge ports 32*f*, and the ammonia discharge ports 33*f*) are formed at predetermined intervals along the extending direction of the respective gas supply pipes (the HCD supply pipe 31*a*, the DCS supply pipe 32*a*, and the ammonia supply pipe 33*a*). Each of the discharge ports discharges gas in the horizontal direction. The interval between the discharge ports is set to be the same as the interval between the substrates W held by the boat 14, for example. The position of each discharge port in the height direction is set at an intermediate position between the substrates W adjacent to each other in the vertical direction. With this, each discharge port can efficiently supply the gas to the facing surfaces of the adjacent substrates W.

The gas supply 30 may mix multiple types of gases and discharge the mixed gas from one gas supply pipe. The respective gas supply pipes (the HCD supply pipe 31*a*, the DCS supply pipe 32*a*, the ammonia supply pipe 33*a*, the nitrogen gas supply pipe 34*a*) may have shapes or arrangements different from each other. The gas supply 30 may include a supply configured to supply another gas in addition to the HCD gas, the DCS gas, and the ammonia gas.

The exhaust section 40 includes a cover member 41, an exhaust pipe 42, a pressure control valve 43, and a vacuum pump 44. The cover member 41 is attached to a portion corresponding to the exhaust port 24 of the processing chamber 10 so as to cover the exhaust port 24. The cover member 41 extends vertically along an outer wall of the processing chamber 10. The exhaust pipe 42 is connected to a lower portion of the cover member 41. The pressure control valve 43 and the vacuum pump 44 are provided in the exhaust pipe 42. The pressure control valve 43 controls the pressure in the processing chamber 10. The vacuum pump 44 exhausts the inside of the processing chamber 10.

The heater section 50 is provided around the processing chamber 10. The heater section 50 includes, for example, a heater. The heater heats each of the substrates W in the processing chamber to a predetermined temperature by controlling the output.

The plasma generation mechanism 60 is provided on a portion of the sidewall of the processing chamber 10. The plasma generation mechanism 60 generates plasma from the ammonia gas supplied from the ammonia supply pipe 33*a*. The plasma generation mechanism 60 includes the plasma partition wall 61, a pair of plasma electrodes 62, a power supply line 63, an RF power supply 64, and an insulating protection cover 65.

The plasma partition wall 61 is airtightly welded to the outer wall of the processing chamber 10. The plasma partition wall 61 is made of, for example, quartz. The plasma partition wall 61 has a recessed shape in a horizontal cross section. The plasma partition wall 61 covers the opening 23. The plasma partition wall 61 forms the plasma generation space P communicating with the inside of the processing chamber 10.

Each of the pair of plasma electrodes 62 has a vertically elongated shape. The pair of plasma electrodes 62 are provided on the outer surfaces of the facing walls of the plasma partition wall 61. The pair of plasma electrodes 62 are disposed to face each other such that the facing walls of the plasma partition wall 61 and the plasma generation space P are interposed by the pair of plasma electrodes 62. The power supply line 63 is connected to a lower end of each of the plasma electrodes 62.

The power supply line 63 electrically connects each of the plasma electrodes 62 and the RF power supply 64. For example, one end of the power supply line 63 is connected to the lower end of each plasma electrode 62, and the other end of the power supply line 63 is connected to the RF power supply 64.

The RF power supply 64 is connected to the lower end of each of the plasma electrodes 62 via the power supply line 63. The RF power supply 64 supplies RF power of, for example, 13.56 MHz to the pair of plasma electrodes 62. With this, the RF power is applied to the plasma generation space P, and plasma is generated from the ammonia gas supplied to the plasma generation space P.

The insulating protection cover 65 is attached to the outside of the plasma partition wall 61 so as to cover the plasma partition wall 61. A coolant passage (not illustrated) may be provided in an inner portion of the insulating protection cover 65. In this case, the plasma electrodes 62 can be cooled by flowing a coolant through the coolant passage.

The controller 90 controls the operation of each section of the film deposition apparatus 1. The controller 90 may be, for example, a computer. A computer program for performing the operation of each section of the film deposition apparatus 1 is stored in a storage medium. The storage medium may be, for example, a flexible disk, a compact disk, a hard disk, a flash memory, a DVD, or the like.

[Operation of Film deposition Apparatus]

The operation performed in the film deposition apparatus 1 when the film deposition method according to the embodiment is performed will be described.

First, the controller 90 controls the raising and lowering mechanism (not illustrated) to transfer the boat 14 holding multiple substrates W into the processing chamber 10, and airtightly closes and seals the opening at the lower end of the processing chamber 10 with the cover 18. Subsequently, the controller 90 controls the exhaust section 40 to decompress the inside of the processing chamber 10. Additionally, the controller 90 controls the heater section 50 to adjust the temperature of the substrate W to the first temperature (step S2 in FIG. 1). Each of the substrates W may be the substrate 100 described above.

Next, the controller 90 controls the gas supply 30 to alternately and repeatedly supply the HCD gas and the ammonia gas into the processing chamber 10 in a state where the heater section 50 is controlled to maintain the temperature of the substrate W at the first temperature (step S3 in FIG. 1). With this, the seed layer 104 is formed on the Ru film 103 by the thermal ALD method.

Next, the controller 90 controls the heater section 50 to change the temperature of the substrate W from the first temperature to the second temperature (step S4 in FIG. 1).

Next, the controller 90 controls the gas supply 30 to alternately and repeatedly supply the DCS gas and the ammonia gas into the processing chamber 10 in a state where the heater section 50 is controlled to maintain the temperature of the substrate W at the second temperature (step S5 of FIG. 1). Additionally, when the controller 90 supplies the ammonia gas into the processing chamber 10, the controller 90 controls the RF power supply 64 to supply an RF power of, for example, 13.56 MHZ to the pair of plasma electrodes 62, thereby generating plasma from the ammonia gas. With this, the bulk layer 105 is formed on the seed layer 104 by the plasma ALD method.

Next, the controller 90 raises the pressure in the processing chamber 10 to the atmospheric pressure and lowers the temperature in the processing chamber 10 to a temperature for transferring, and then controls the raising and lowering mechanism to transfer the boat 14 out of the processing chamber 10. As described above, the SiN film 106 in which the seed layer 104 and the bulk layer 105 are stacked can be formed on each of the substrates W held in the boat 14.

EXAMPLES

Example 1

First, a substrate on which the thermal oxide film, the TiN film, and the Ru film were stacked in this order was prepared. Subsequently, the prepared substrate was accommodated in the processing chamber of the film deposition apparatus 1, and the seed layers were formed on the Ru films at different substrate temperatures by the thermal ALD method. Subsequently, the sheet resistance of the Ru film was measured. For comparison, the sheet resistance of the Ru film before the seed layer was formed was measured. The conditions of forming the seed layer are described below.

(Seed Layer Forming Conditions)

Substrate temperature: 400° C., 550° C., 630° C.

First silicon-containing gas: HCD gas

First nitriding gas: ammonia gas

Seed layer thickness: 0.6 nm

Figure 5:
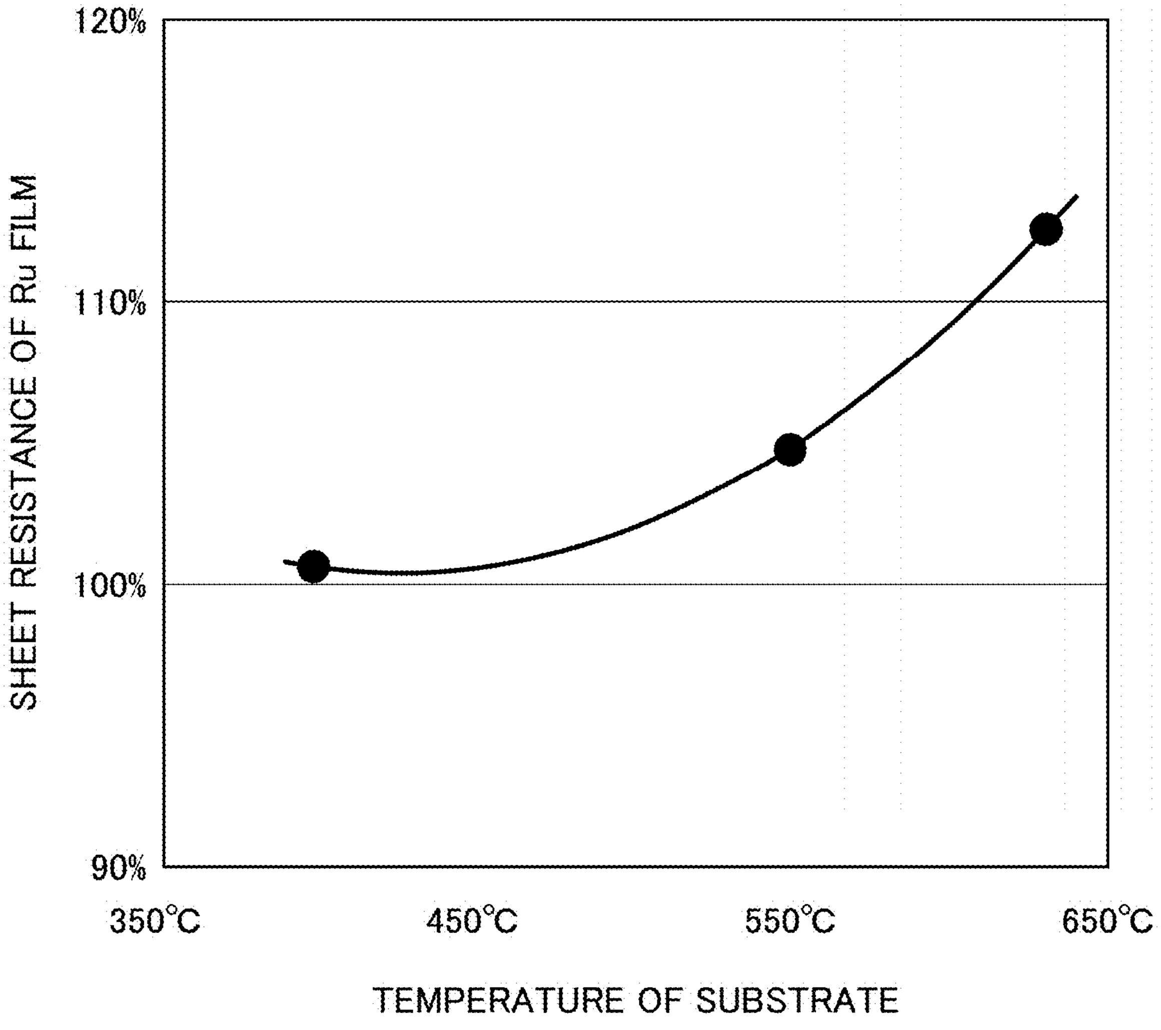
FIG. 5 is a graph indicating a relationship between the substrate temperature and the sheet resistance of a Ru film.

FIG. 5 is a graph indicating a relationship between the substrate temperature and the sheet resistance of the Ru film. In FIG. 5, the horizontal axis represents the substrate temperature [° C.] when the seed layer is formed, and the vertical axis represents the sheet resistance [%] of the Ru film. The sheet resistance of the Ru film in FIG. 5 is indicated by a relative value when the resistivity of the Ru film before the seed layer is formed is set to 100%.

As indicated in FIG. 5, when the substrate temperature when the seed layer is formed is 400° C., 550° C., and 630° C., the sheet resistances of the Ru films are respectively 101%, 105%, and 113%. From this result, it is conceivable that by setting the substrate temperature when the seed layer is formed to 550° C. or less, the increase in the sheet resistance of the Ru film can be suppressed. Additionally, it is conceivable that by setting the substrate temperature when the seed layer is formed to 400° C. or less, the increase in the sheet resistance of the Ru film due to the formation of the seed layer can be prevented. As described above, it can be said that the substrate temperature when the seed layer is formed is preferably 550° C. or less, and more preferably 400° C. or less.

Example 2

First, a substrate having a trench in which the thermal oxide film, the TiN film, and the Ru film were stacked in this order on a surface thereof was prepared. Subsequently, the prepared substrate was accommodated in the processing chamber 10 of the film deposition apparatus 1, and seed layers having different thicknesses were formed on the Ru films by the thermal ALD method. Subsequently, bulk layers having different thicknesses were formed on the seed layers by the plasma ALD method. In each condition, the total thickness of the seed layer and the bulk layer was set to be equal. Subsequently, the interconnect resistance of the Ru film was measured. For comparison, the interconnect resistance of the Ru film before the seed layer was formed was measured. The conditions of forming the seed layer and the bulk layer are described below.

(Seed Layer Forming Conditions)

Substrate temperature: 400° C.

First silicon-containing gas: HCD gas

First nitriding gas: ammonia gas

Seed layer thicknesses: 0.4 nm, 0.6 nm, 0.8 nm (Bulk Layer Forming Conditions)

Substrate temperature: 630° C.

Second silicon-containing gas: DCS gas

Second nitriding gas: ammonia gas

Bulk layer: 1.6 nm (when the thickness of the seed layer is 0.4 nm)

1.4 nm (when the thickness of the seed layer is 0.6 nm)

1.2 nm (when the thickness of the seed layer is 0.8 nm)

Figure 6:
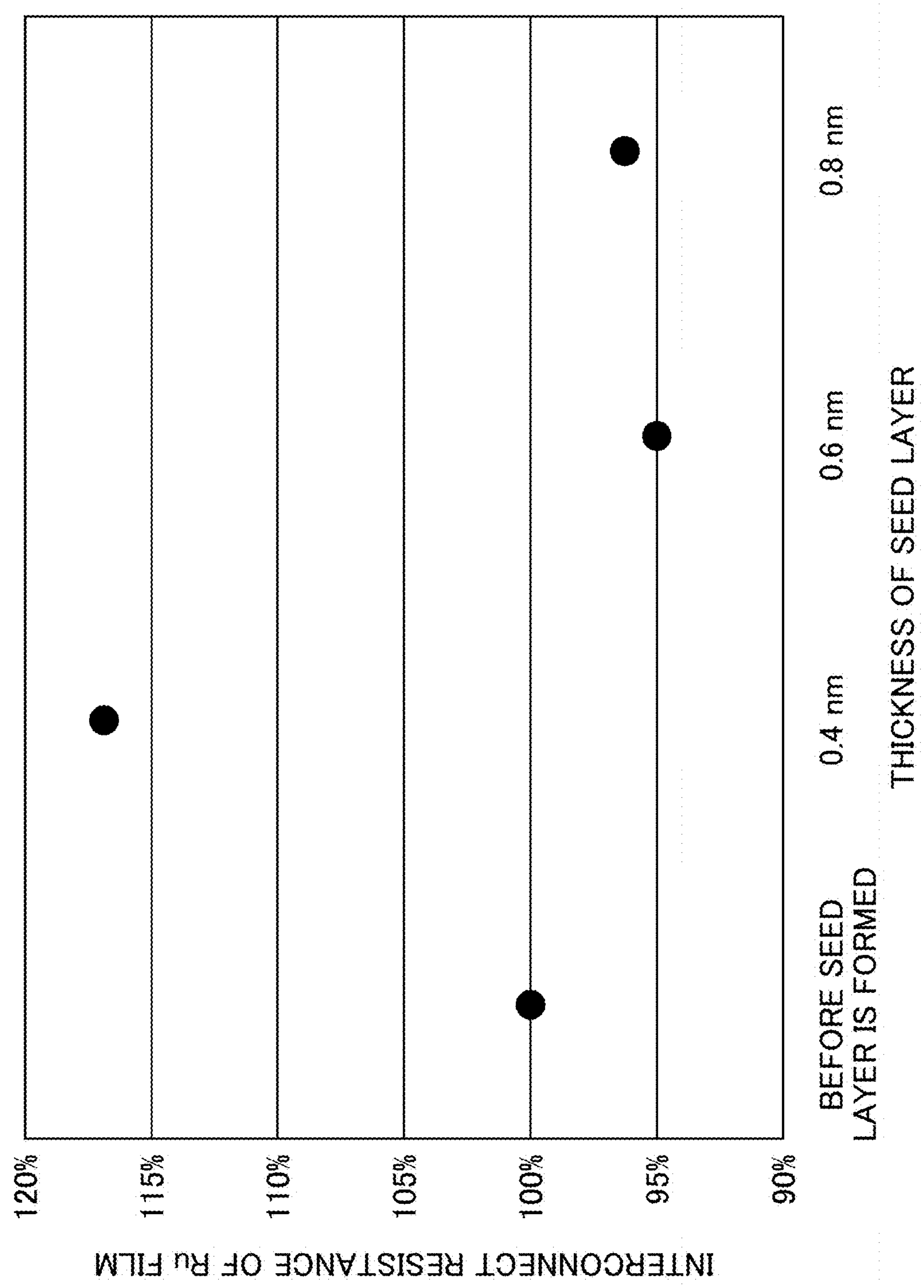
FIG. 6 is a graph indicating a relationship between the thickness of a seed layer and the interconnect resistance of the Ru film.

FIG. 6 is a graph indicating a relationship between the thickness of the seed layer and the interconnect resistance of the Ru film. The interconnect resistance of the Ru film in FIG. 6 is indicated as a relative value when the interconnect resistance of the Ru film before the seed layer is formed is set to 100%.

As indicated in FIG. 6, when the thicknesses of the seed layers are 0.4 nm, 0.6 nm, and 0.8 nm, the interconnect resistances of the Ru film are 117%, 95%, and 96%. From this result, it is conceivable that by setting the thickness of the seed layer to 0.6 nm or greater, the increase in the interconnect resistance of the Ru film due to the formation of the seed layer can be prevented. As described above, the thickness of the seed layer is preferably 0.6 nm or greater.

Example 3

First, a substrate on which the thermal oxide film, the TiN film, and the Ru film were stacked in this order was prepared. Subsequently, the prepared substrate was accommodated in the processing chamber of the film deposition apparatus 1, and the seed layer was formed on the Ru film by the thermal ALD method. Subsequently, bulk layers were formed on the seed layers by different deposition methods. Subsequently, the sheet resistance of the Ru film was measured. For comparison, the sheet resistance of the Ru film before the seed layer was formed was measured. The conditions of forming the seed layer and the bulk layer are described blow.

(Seed Layer Forming Conditions)

Substrate temperature: 400° C. and 630° C.

First silicon-containing gas: HCD gas

First nitriding gas: ammonia gas

Seed layer thickness: 0.6 nm (Bulk Layer Formation Conditions)

Substrate temperature: 630° C.

Second silicon-containing gas: DCS gas and HCD gas

Second nitriding gas: ammonia gas

Bulk layer thickness: 1.4 nm

Deposition method: PE-DCS (Plasma ALD method, Second silicon-containing gas: DCS gas)

Th-DCS (Thermal ALD method, Second silicon-containing gas: DCS gas)

Th-HCD (Thermal ALD method, Second silicon-containing gas: HCD gas)

Figure 7:
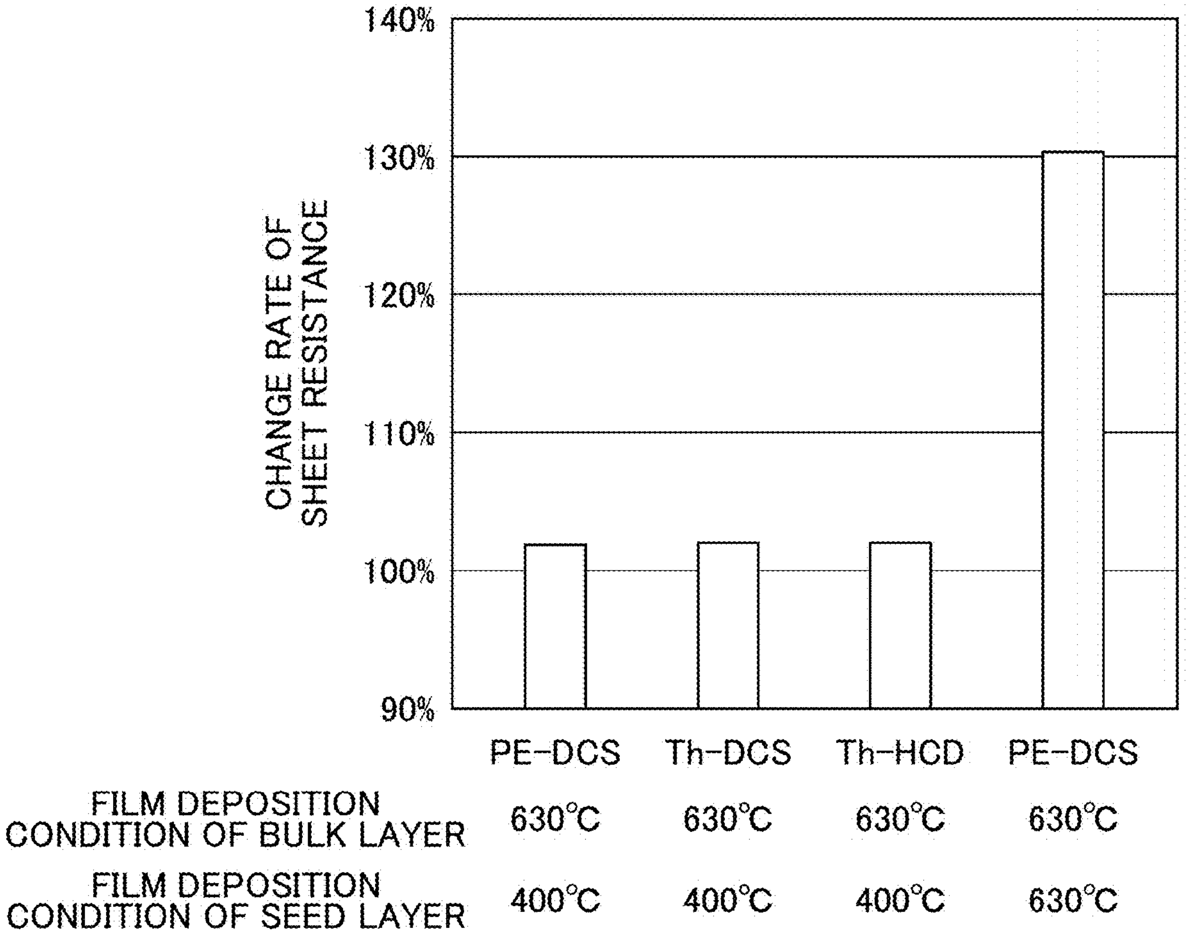
FIG. 7 is a graph indicating a relationship between a deposition method of a bulk layer and the sheet resistance of the Ru film.

FIG. 7 is a graph indicating a relationship between the deposition method of the bulk layer and the sheet resistance of the Ru film. The sheet resistance of the Ru film in FIG. 7 is indicated as a relative value when the sheet resistance of the Ru film before the seed layer is formed is set to 100%. In FIG. 7, the leftmost bar chart indicates the result of forming the bulk layer by the plasma ALD method using the DCS gas as the second silicon-containing gas (PE-DCS). The second bar chart from the left indicates the result of forming the bulk layer by the thermal ALD method using the DCS gas as the second silicon-containing gas (Th-DCS). The third bar chart from the left indicates the result of forming the bulk layer by the thermal ALD method using the HCD gas as the second silicon-containing gas (Th-HCD). The rightmost bar chart indicates the result of changing the substrate temperature from 400° C. to 630° C. when the seed layer is formed with respect to the leftmost bar chart.

As indicated in FIG. 7, when the seed layer is formed at the substrate temperature of 400° C., regardless of the difference in the deposition method of the bulk layer formed on the seed layer, the sheet resistance of the Ru film is 102%. From this result, it is conceivable that when the seed layer is formed at the substrate temperature of 400° C., the increase in the sheet resistance of the Ru film can be suppressed even if the deposition method of the bulk layer is changed.

Example 4

First, a substrate on which the thermal oxide film, the TiN film, and the Ru film were stacked in this order was prepared. Subsequently, the prepared substrate was accommodated in the processing chamber of the film deposition apparatus 1, and the seed layers were formed on the Ru films at different substrate temperatures by the thermal ALD method. Subsequently, the bulk layer was formed on the seed layer by the plasma ALD method. Next, a cross section of the substrate was observed with a transmission electron microscope (TEM). The conditions of forming the seed layer and the bulk layer are described below.

(Seed Layer Forming Conditions)

Substrate temperature: 400° C., 630° C.

First silicon-containing gas: HCD gas

First nitriding gas: ammonia gas

Seed layer thickness: 0.6 nm (Bulk Layer Formation Conditions)

Substrate temperature: 630° C.

Second silicon-containing gas: DCS gas

Second nitriding gas: ammonia gas

Bulk layer thickness: 1.4 nm

Figure 8:
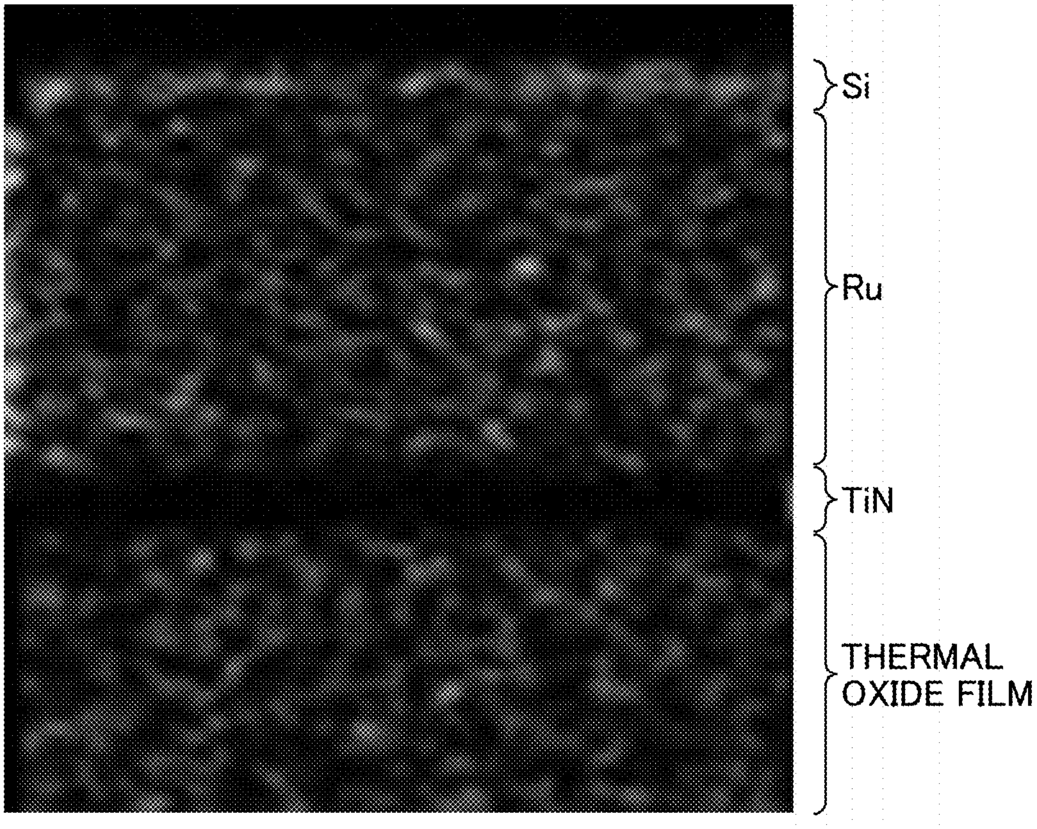
FIG. 8 is an image indicating a state of an interface between the Ru film and a SiN film.
Figure 9:
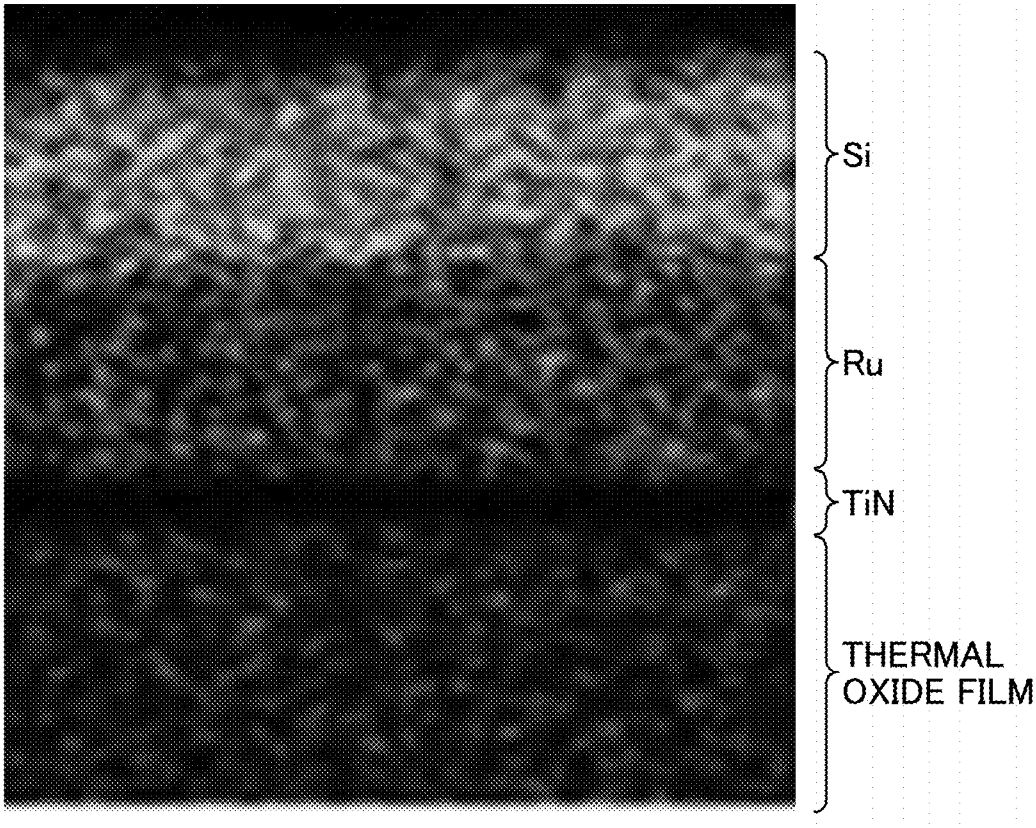
FIG. 9 is an image indicating a state of the interface between the Ru film and the SiN film.

FIG. 8 and FIG. 9 are images indicating the interface states between the Ru film and the SiN film. FIG. 8 is a cross-sectional TEM image of the substrate when the seed layer is formed at a substrate temperature of 400° C. FIG. 9 is a cross-sectional TEM image of the substrate when the seed layer is formed at a substrate temperature of 630° C.

As indicated in FIG. 8, when the seed layer is formed at a substrate temperature of 400° C., the diffusion of silicon (Si) atoms contained in the SiN film (the stacked body of the seed layer and the bulk layer) into the Ru film is hardly observed. With respect to the above, as indicated in FIG. 9, it is found that when the seed layer is formed at a substrate temperature of 630° C., silicon (Si) atoms contained in the SiN film (the stacked body of the seed layer and the bulk layer) are diffused into the Ru film. From this result, it is conceivable that, by forming the seed layer at the substrate temperature of 400° C. before the bulk layer is formed on the Ru film, the diffusion of the silicon (Si) atoms contained in the SiN film into the Ru film can be suppressed, and the increase in resistance of the Ru film can be suppressed.

The embodiments disclosed herein should be considered in all respects as illustrative and not restrictive. The above-described embodiments may be omitted, replaced, and modified in various forms without departing from the scope and spirit of the appended claims.

In the above-described embodiment, the case where the first silicon-containing gas is the HCD gas and the second silicon-containing gas is the DCS gas has been described, but the present disclosure is not limited thereto. For example, each of the first silicon-containing gas and the second silicon-containing gas may be selected from a monochlorosilane (MCS) gas, a dichlorosilane (DCS) gas, a trichlorosilane (TCS) gas, a hexachlorodisilane (HCD) gas, a trisilylamine (TSA) gas, or a combination thereof.

In the above-described embodiments, the case where the first nitriding gas and the second nitriding gas are the ammonia gas has been described, but the present disclosure is not limited thereto. For example, the first nitriding gas and the second nitriding gas may be different gases. For example, each of the first nitridation gas and the second nitridation gas may include ammonia ($NH_3$) gas, diazene ($N_2H_2$) gas, hydrazine ($N_2H_4$) gas, monomethylhydrazine ($CH_3(NH)NH_2$) gas, or a combination thereof.

In the above-described embodiments, the case where the film containing silicon atoms and nitrogen atoms is a silicon nitride film has been described, but the present disclosure is not limited thereto. For example, the film containing silicon atoms and nitrogen atoms may contain another element. For example, the film containing silicon atoms and nitrogen atoms may be a Low-k film, such as a SiCN film, a SiON film, a SiOCN film, a SiBN film, or a SiBCN film.

In the above-described embodiment, the case where the metal film is the Ru film has been described, but the present disclosure is not limited thereto. For example, the metal film may be a tungsten (W) film, a cobalt (Co) film, or a molybdenum (Mo) film.

In the above-described embodiments, the case where the seed layer is formed by the thermal ALD method has been described, but the present disclosure is not limited thereto. For example, the seed layer may be formed by the plasma ALD method. For example, the seed layer may be formed by the chemical vapor deposition (CVD) method. The CVD method may be a thermal CVD method or a plasma CVD method.

In the above-described embodiments, the case where the bulk layer is formed by the plasma ALD method has been described, but the present disclosure is not limited thereto. For example, the bulk layer may be formed by the thermal ALD method. For example, the bulk layer may be formed by the CVD method. The CVD method may be a thermal CVD method or a plasma CVD method.

In the above-described embodiments, the case where the film deposition apparatus is a capacitively coupled plasma (CCP) apparatus has been described, but the present disclosure is not limited thereto. For example, the film deposition apparatus may be an inductively coupled plasma (ICP) apparatus, a remote plasma apparatus, or a microwave plasma apparatus.

In the above-described embodiments, the case where the film deposition apparatus is a batch-type apparatus that performs a process on multiple substrates at one time has been described, but the present disclosure is not limited thereto. For example, the film deposition apparatus may be a semi-batch type apparatus in which multiple substrates disposed on a rotary table in a processing chamber are revolved by the rotary table and sequentially pass through multiple processing regions to perform processing on the substrates. For example, the film deposition apparatus may be a single wafer type apparatus that processes substrates one by one.

According to the present disclosure, when a film containing silicon atoms and nitrogen atoms is formed on a metal film, an increase in resistivity of the metal film can be suppressed.

What is claimed is:

1. A film deposition method comprising:

forming a seed layer containing silicon atoms and nitrogen atoms on a metal film of a substrate by supplying a first silicon-containing gas and a first nitriding gas to the substrate in a state where the substrate is maintained at a first temperature; and forming a bulk layer containing silicon atoms and nitrogen atoms on the seed layer by supplying a second silicon-containing gas and a second nitriding gas to the substrate in a state where the substrate is maintained at a second temperature greater than the first temperature.

2. The film deposition method as claimed in claim 1, wherein a thickness of the seed layer is less than a thickness of the bulk layer.

3. The film deposition method as claimed in claim 1, wherein a thickness of the seed layer is 0.6 nm or greater.

4. The film deposition method as claimed in claim 1, wherein the first temperature is 550° C. or less.

5. The film deposition method as claimed in claim 1, wherein the forming of the seed layer includes forming the seed layer by a thermal atomic layer deposition (ALD) method in which the supplying of the first silicon-containing gas and the supplying of the first nitriding gas are alternately repeated.

6. The film deposition method as claimed in claim 1, wherein the forming of the bulk layer includes forming the bulk layer by a plasma ALD method in which the supplying of the second silicon-containing gas and exposing the substrate to plasma generated from the second nitriding gas are alternately repeated.

7. The film deposition method as claimed in claim 1, wherein the second silicon-containing gas is different from the first silicon-containing gas.

8. The film deposition method as claimed in claim 1, wherein the first silicon-containing gas is a hexachlorodisilane gas, and wherein the second silicon-containing gas is a dichlorosilane gas.

9. The film deposition method as claimed in claim 1, wherein the metal film is a ruthenium film.

* * * * *